(12) United States Patent
Tu et al.

(10) Patent No.: US 9,017,903 B2
(45) Date of Patent: Apr. 28, 2015

(54) MASK OVERLAY CONTROL

(71) Applicant: Taiwan Semiconductor Manufacturing Co., Ltd., Hsin-Chu (TW)

(72) Inventors: Chih-Chiang Tu, Tauyen (TW); Chun-Lang Chen, Madou Township (TW); Jong-Yuh Chang, Jhubei (TW); Chien-Chih Chen, Tainan (TW); Chen-Shao Hsu, Huatan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/947,180

(22) Filed: Jul. 22, 2013

(65) Prior Publication Data

US 2015/0024306 A1    Jan. 22, 2015

(51) Int. Cl.
*G03F 1/22* (2012.01)
*G03F 1/24* (2012.01)
*G03F 1/26* (2012.01)
*G03F 1/70* (2012.01)
*G03F 1/82* (2012.01)

(52) U.S. Cl.
CPC .. *G03F 1/70* (2013.01); *G03F 1/82* (2013.01); *G03F 1/22* (2013.01); *G03F 1/24* (2013.01); *G03F 1/26* (2013.01)

(58) Field of Classification Search
USPC ........................................................ 430/5, 30
See application file for complete search history.

(56) References Cited

U.S. PATENT DOCUMENTS

| | | | | |
|---|---|---|---|---|
| 6,440,619 | B1* | 8/2002 | Feldman | 430/30 |
| 7,132,206 | B2* | 11/2006 | Kindt | 430/30 |
| 8,748,198 | B2* | 6/2014 | Teramoto et al. | 438/7 |
| 2001/0046631 | A1* | 11/2001 | Fujiwara et al. | 430/5 |
| 2007/0224521 | A1* | 9/2007 | Furukawa | 430/5 |
| 2010/0097588 | A1* | 4/2010 | Phillips et al. | 355/53 |

* cited by examiner

*Primary Examiner* — Christopher Young
(74) *Attorney, Agent, or Firm* — Eschweiler & Associates, LLC

(57) ABSTRACT

Some embodiments of the present disclosure relate to a method of patterning a workpiece with a mask, wherein a scale factor between a geometry of the mask and a corresponding target shape of the mask is determined. The scale factor results from thermal expansion of the mask and geometry due to heating of the mask during exposure to radiation by an electron beam (e-beam) in the mask manufacturing process. A number of radiation pulses necessary to dispose the geometry on the mask is determined. A scale factor for the mask is then determined from the number of pulses. The target shape is then generated on the mask by re-scaling the geometry according to the scale factor prior to mask manufacturing. This method compensates for thermal deformation due to e-beam heating to improve OVL variability in advanced technology nodes.

20 Claims, 6 Drawing Sheets

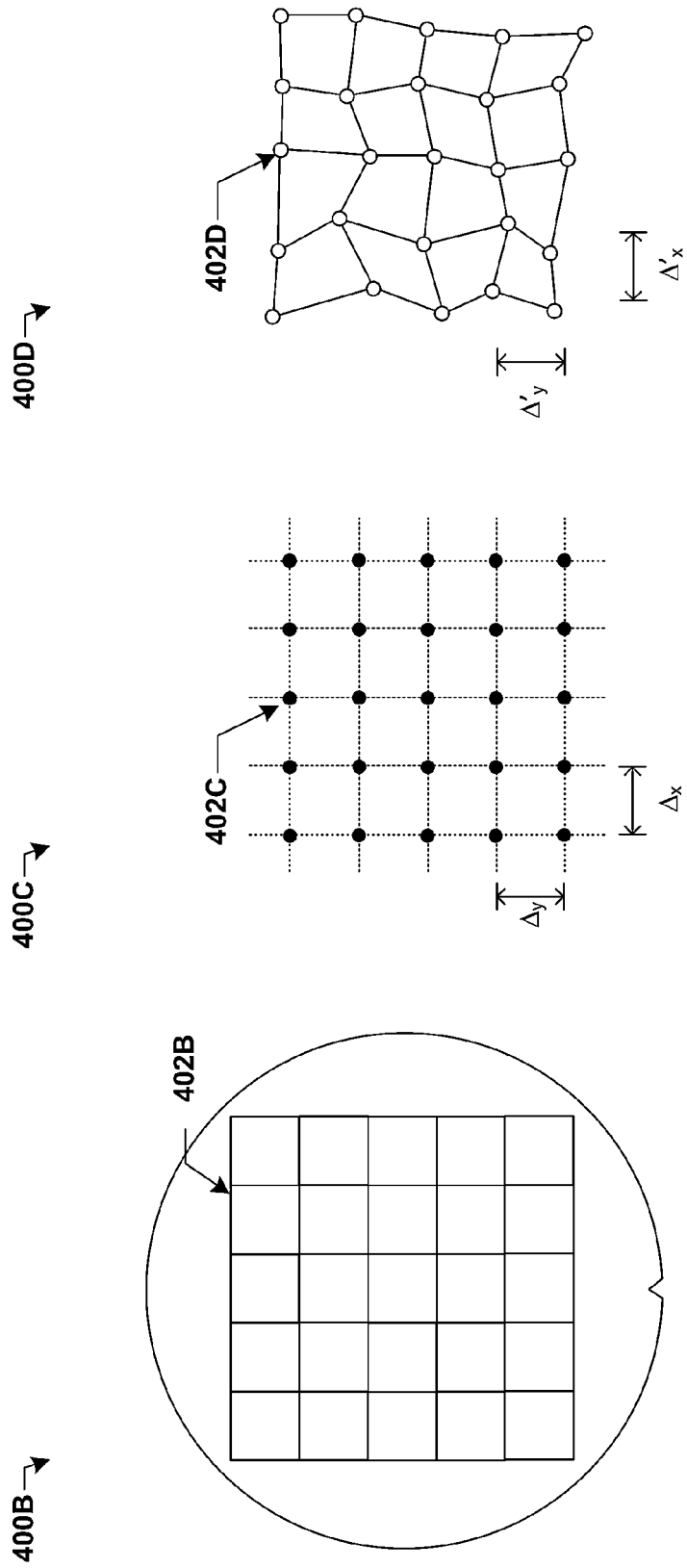

MASK OVERLAY CONTROL

BACKGROUND

Integrated chip (IC) manufacturing includes layer deposition, patterning, and etch to form device components (e.g., gate, source/drain, doped regions, etc.). Patterning of substrate includes spin coating a layer of photoresist over the surface of the semiconductor substrate, and exposing the surface to radiation which is filtered by a photomask. Manufacturing variation in formation of the photomask induces variation in the patterned geometries on the surface of the photomask, which translates into variation in features patterned by the photomask.

BRIEF DESCRIPTION OF THE DRAWINGS

FIGS. 4A-4E illustrate some embodiments of a method to derive a linear model of the thermal expansion of a photomask.

DETAILED DESCRIPTION

Figure 1:
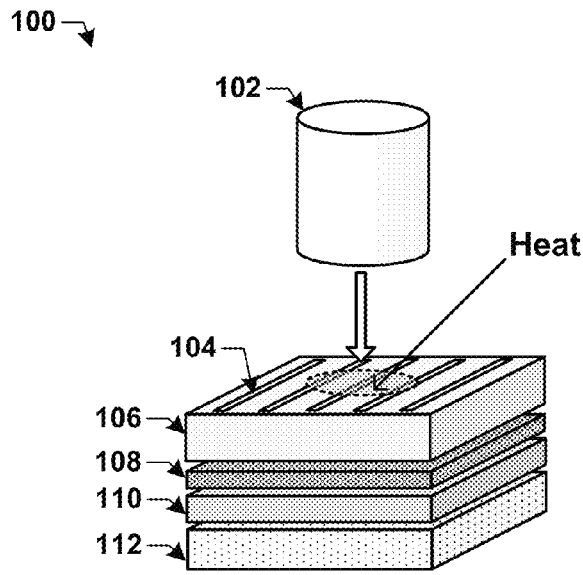
FIG. 1 illustrates some embodiments of a mask patterning system comprising a mask writing tool.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

In semiconductor manufacturing multiple photomasks are used to build up patterned layers of a device structure through successive lithography steps, which requires precision alignment between the photomasks. Overlay (OVL) error, a misalignment between two or more photomasks used in successive patterning steps, can degrade device performance and reduce chip yield (e.g., contacts must be aligned to the source or drain of a transistor, etc.). In advanced technology nodes such as 22 nm, 16 nm, and beyond, OVL control is a growing consideration as static tool capability drives increasing OVL variation relative to nominal features sizes. These increasing effects are compounded where multiple masks are needed to resolve a single feature such as double-patterning (DP) lithography. DP lithography processes allow for an increased feature density over single-patterning (SP) lithography, but may be subject to additional process variation due to mask overlay (OVL) variability from increased mask usage.

Some photomasks are produced by coating a mask blank with photoresist in a spin-on tool, exposing the mask blank to an electron beam (e-beam) to form a pattern, and selectively etching the pattern into the mask blank. E-beam writers are used to pattern photomasks in advanced technology nodes due to their high resolution relative to other techniques. However, e-beam patterning heats the mask blank causing thermal expansion, and in some instances contraction upon cooling after writing, but not necessarily to the original shape and size. This thermal cycling alters the patterned shapes on the mask and can increase mask OVL variability between shapes aligned on two or more such masks. Moreover, as a number of pulses used to pattern the mask increases, the magnitude of thermal cycling induced by the e-beam writer increases, resulting in greater thermal expansion. Pulse number variation between two or more masks used to form a device can result in different amounts of thermal expansion, even for two shapes of the same designed dimensions residing on the two or more masks.

Some prior art techniques aimed to mitigate thermal expansion techniques include a "low-stress" mask, which can reduce mask strain effect during mask processing. A grid matching correction model can compensate for residual OVL error by mapping an orthogonal design grid on the measured wafer topology. And, a charging effect correction model can compensate for position error of the e-beam induced by an electric-field in a surface features such as photoresist. Other mitigation techniques exist. However, these techniques do not effectively reduce mask OVL variability due to e-beam induced thermal cycling as a function of pulse number.

Accordingly, some embodiments of the present disclosure relate to a method of patterning a workpiece with a mask, wherein a scale factor between a geometry of the mask and a corresponding target shape of the mask is determined. The scale factor results from thermal expansion of the mask and geometry due to heating of the mask during exposure to radiation by an electron beam (e-beam) in the mask manufacturing process. A number of radiation pulses necessary to dispose the geometry on the mask is determined. A scale factor for the mask is then determined from the number of pulses. The target shape is then generated on the mask by re-scaling the geometry according to the scale factor prior to mask manufacturing. This method compensates for thermal deformation due to e-beam heating to improve OVL variability in advanced technology nodes. This invention can be used for any kind of writer that utilizes an energy-flow to active the photoresist disposed on a mask blank which results in thermal expansion of the mask blank during mask patterning. Other methods and associated tools are also disclosed.

FIG. 1 illustrates some embodiments of a mask patterning system 100 comprising a mask writing tool 102. The mask writing tool 102 is configured to pattern a photomask, and may include an electron beam (e-beam) writer, laser writing tool, or multi-beam writer. The mask writing tool 102 is configured to produce a pattern 104 in a photoresist layer 106 disposed over an opaque shielding layer 108 residing on a transparent mask blank 112.

In some embodiments, the mask blank 112 comprises quartz. In various embodiments, the mask blank may be utilized to form a wide range of photomasks including, but not limited to, binary intensity masks (BIMs), attenuated phase shift masks (APSMs) which utilize interference effects to improve image resolution, and reflective reticles (e.g., a Bragg reflector) used in extreme ultraviolet (EUV) lithography.

The photoresist layer 106 has a thickness in a range between about 10 nm and about 100 nm. In some embodiments, the photoresist layer 106 may comprise a chemically amplified resin (CAR). In some embodiments, the photoresist layer 106 may comprise a positive tone photoresist, which becomes soluble when exposed to radiation from the mask writing tool 102. In other embodiments, the photoresist layer 106 may comprise a negative tone photoresist, which becomes insoluble when exposed to radiation.

The opaque shielding layer 108 is configured to block the transmission of electromagnetic radiation, and has a thickness in a range between about 1 nm and about 10 nm. In some embodiments, an opaque shielding layer 108 may comprise a chromium (Cr) or chromium oxide ($CrO_x$).

In some embodiments, a phase shifting layer 110 with a thickness in a range of about 10 nm to about 100 nm may be disposed on the mask blank 112, and is configured to introduce a phase shift into electromagnetic radiation provided by the mask writing tool 102. In some embodiments, the phase shifting layer 110 comprises an opaque layer of molybdenum silicide (MoSi). It is be appreciated that the MoSi layer is not formed as alternating layers of molybdenum and silicide (i.e., a Bragg reflector), but rather as an opaque shielding layer of molybdenum silicide that is used during photolithographic exposures to aid patterning of deep ultraviolet radiation. In other embodiments, the phase shifting layer 110 comprises opaque layer of molybdenum silicide oxynitride ($Mo_xSi_yON_z$), which is used as a half tone material in optical lithography.

The pattern 104 is produced by discrete pulses, or "shots" of radiation (e.g., laser light, electrons, etc.) from the mask writing tool 102. Upon etching, the pattern 104 is transferred to the opaque shielding layer 108. While the mask writing tool 102 supports a high resolution of mask features, it can also cause heating of the mask blank 112 and associated layers, which results in thermal expansion, which can change feature size and space for the pattern 104. This variation in feature size has been demonstrated to degrade OVL performance when the photomask is used to pattern a semiconductor substrate. Moreover, it has also been demonstrated that as the number of pulses needed to resolve a photomask shape is increased, the OVL performance of the photomask increases.

Figure 2:
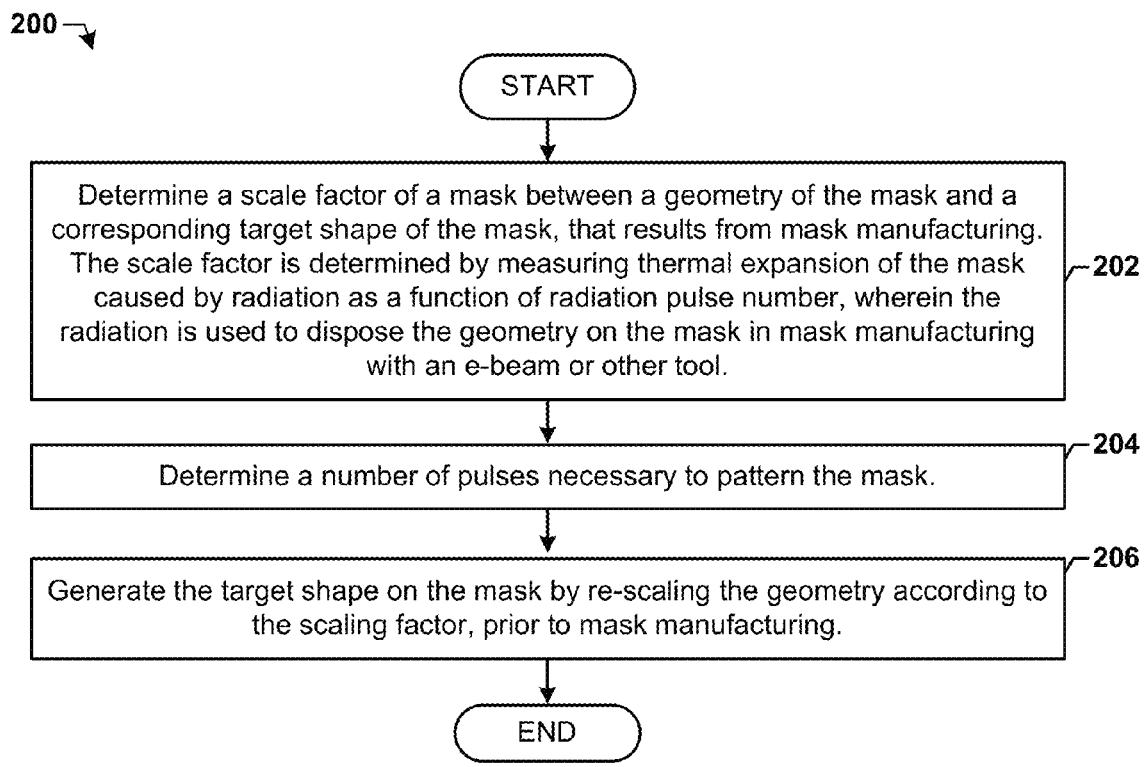
FIG. 2 illustrates some embodiments of a method of photomask formation which mitigates OVL degradation due to thermal expansion.

FIG. 2 illustrates some embodiments of a method 200 of photomask formation which mitigates OVL degradation due to thermal expansion. While the method 200, and subsequently method 400E, are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202 a scale factor of a mask that results from mask manufacturing is determined. The scale factor is between a geometry of the mask and a corresponding target shape of the mask (i.e., the intended shape vs. the actual shape), and maybe determined by measuring the size of the mask before and after the manufacturing process. The scale factor is determined by measuring thermal expansion of the mask caused by radiation as a function of radiation pulse number, wherein the radiation is used to dispose the geometry on the mask in mask manufacturing.

At 204 a number of pulses necessary to dispose the geometry are determined.

At 206 the target shape is generated on the mask by re-scaling the geometry according to the scaling factor, prior to mask manufacturing, to mitigate the effects of the thermal expansion.

Figure 3A:
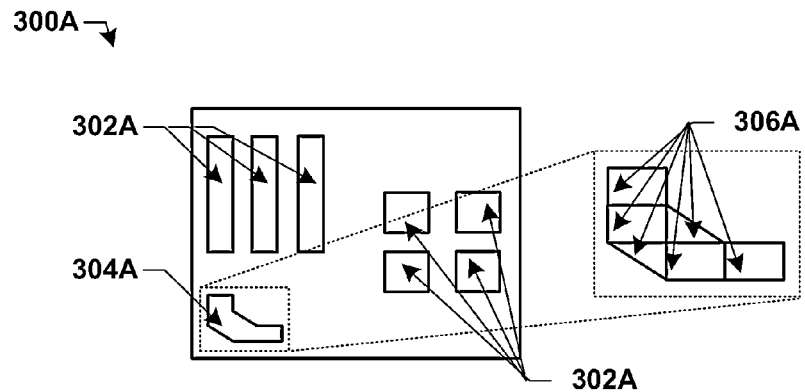
FIGS. 3A-3C illustrate some embodiments of a photomask patterning, deformation due to heat energy transfer, and shape decomposition onto two different masks.

FIG. 3A illustrates some embodiments of a photomask 300A (e.g., quartz), comprising a plurality of first geometries 302A and a second geometry 304A. A shot count number for each of the plurality of first and second geometries 302A, 304A is defined as the number of pulses of focused radiation from a mask writing tool (e.g., e-beam writer) that are requisite to create a respective geometry. For instance, it is shown that six pulses 306A are needed to form the second geometry 304A.

Figure 3B:
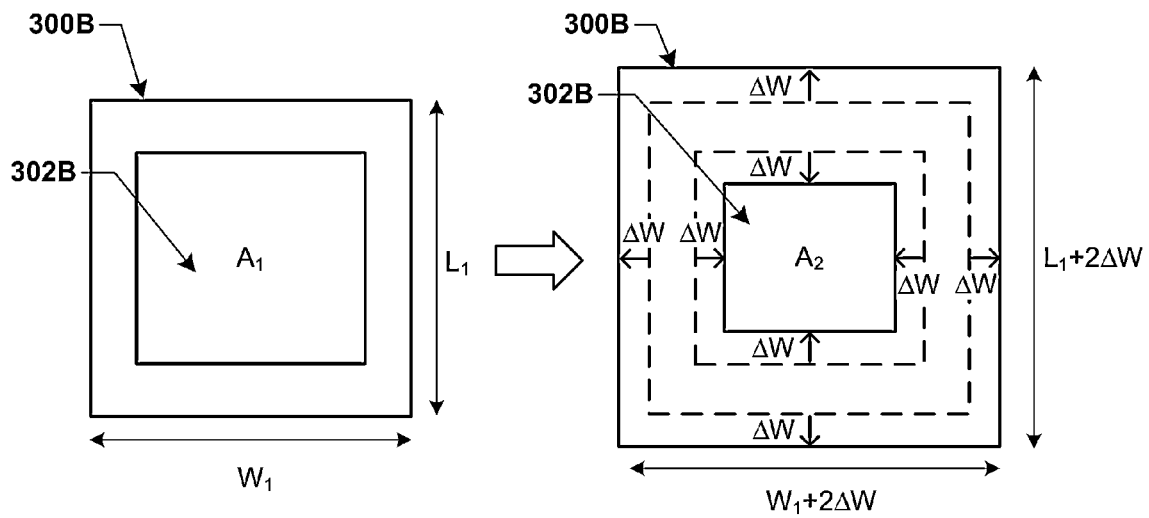

FIG. 3B illustrates an example of thermal expansion due to heat energy transferred from radiation pulses into a photomask 300B, which causes deformation in the form of an isotropic expansion of the photomask 300B by an amount $\Delta W$ on all edges. For the embodiments of FIG. 3B, the photomask 300B comprises a rectangle of length $L_1$ and width $W_1$. In some embodiments, the expansion may be anisotropic, wherein various edges expand by different amounts due to a material property of the photomask 300B. After expansion, the photomask 300B comprises a rectangle of length $L_1+2\Delta W$ and width $W_1+2\Delta W$.

A single geometry 302B resides on the photomask 300B. The geometry 302B comprises a first area $A_1$ before thermal expansion. For the embodiments of FIG. 3B, the geometry 302B comprises an enclosed area defined by a cut out of the photomask 300B, and the thermal expansion of the photomask 300B by the amount $\Delta W$ decreases the enclosed area of the photomask 300B to a second area $A_2$ after expansion. Other embodiments may comprise scenarios where the enclosed area increases, or where the interior edges also experience an anisotropic expansion or contraction.

Figure 3C:
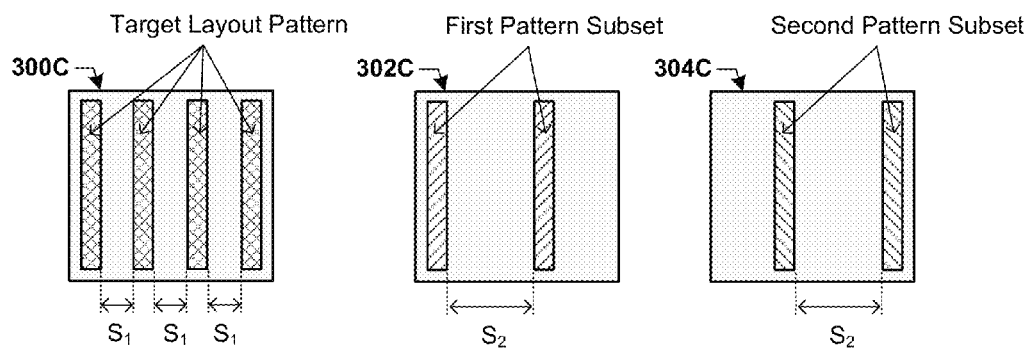

FIG. 3C illustrates some embodiments of shape decomposition onto two different masks (302C, 304C) for double-patterning (DP) lithography. DP lithography, and in general multiple-patterning (MP) lithography such as litho-etch-litho-etch (LELE), self-aligned double patterning (SADP), etc., effectively decreases spaces between shapes formed on a patterned substrate over that which is achievable by single-patterning (SP). For the exemplary embodiments of FIG. 3C, a target layout pattern formed on a first mask 300C comprising shapes of a first uniform spacing $S_1$ are not resolvable through a single exposure process (i.e., $S_1$ lies below the resolution limit of the radiation used to pattern a workpiece with the first mask 300C). Note that in general the space between shapes need not be uniform for DP and MP lithography, but simply below the resolution limit of the radiation used for workpiece patterning (e.g., light).

To achieve double-patterning (DP), the target layout pattern must be decomposed onto two or more masks, and used to pattern the workpiece in two or more exposure steps, wherein the two are masks are overlayed to reproduce the target layout pattern. To ensure the design is decomposable, layout restrictions in the form of design rules, post-layout manipulation of shapes, etc. are utilized when creating the target pattern. Consequently, the target layout pattern is decomposed into a first pattern "color" or subset with a space $S_2$ on a second mask 302C, and a second pattern "color" or subset with the space $S_2$ on a third mask 304C. In such DP, and by extension MP, scenarios, a scale factor function defined as the scale factor as a function of a number of radiation pulses may be individually applied to each mask. When decomposing the geometries onto two or more masks, and determining the number of pulses necessary to pattern each of the two or more masks, each of the two or more masks and respective decomposed geometries may be inversely-scaled by a scale factor value determined from the scale factor function which corresponds to the number of pulses for the respective mask to ensure shape uniformity between the two or more masks.

Figure 4A:
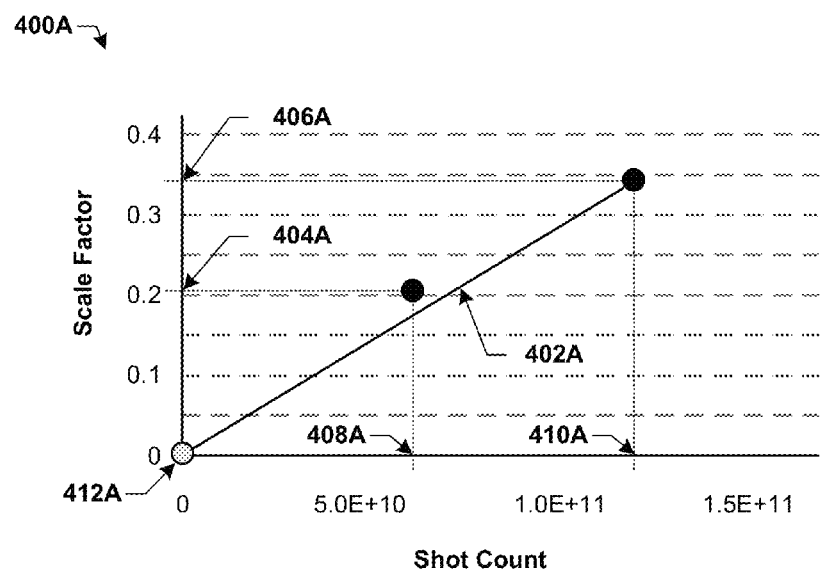

FIG. 4A illustrates a graph 400A of a linear model 402A of the thermal expansion of a photomask, which plots first and second scale factors 404A, 406A observed when forming first and second patterns on first and second masks with first and second numbers of respective radiation pulses (i.e., shot counts) 408A, 410A in a mask writing tool. The linear model 402A of the thermal expansion of the first and second masks may be defined by measuring the first and second scale factors 404A, 406A of the first and second mask, respectively, as functions of the first and second number of radiation pulses 408A, 410A, and fitting a linear function (402A) through the origin 412A, a first point of intersection of the first scale factor 404A and the first number of pulses 408A, and a second point of intersection of the second scale factor 406A and the second number of pulses 410A. A scale factor may comprise a ratio of edge lengths, areas, etc. between the first and second photomasks.

In some embodiments, the size of the mask before and after thermal expansion is measured directly. In some embodiments, the scale factor is determined indirectly by patterning features on a workpiece with the mask, and determining the scale factor from the patterned features. FIG. 4B illustrates some embodiments of a semiconductor wafer 400B (e.g., Si or SOI), whereupon a plurality of reticle fields 402B are arranged. In some embodiments, the wafer may comprise a 300 mm wafer or a 450 mm wafer, wherein each reticle field 402B is exposed individually utilizing the photomask to form the pattern. In some embodiments, a step-and-repeat tool is used to align the photomask with each reticle field 402B, and expose to a light source to form a pattern comprising patterned features within the respective reticle field 402B before "stepping" to a next periodic location of the next reticle field 402B.

For ideal conditions (e.g., no OVL variation, critical dimension (CD) variation for the patterned features, etc.), the patterned features within an individual reticle field 402B will fall on an ideal grid 400C, as illustrated in the embodiments of FIG. 4C, wherein the ideal grid 400C comprises a ideal periodicity of ideal locations 402C along the x-direction ($\Delta_x$) and along the y-direction ($\Delta_y$) within the reticle field 402B. In practice, variations in manufacturing conditions, wafer topology, and mask variation (i.e., due to thermal expansion) will distort both the size and the ideal location 402C of the patterned features.

FIG. 4D illustrates a real grid 402D comprising real locations 402D of the patterned features. After patterning, a residual OVL value indicating the quality of the alignment is calculated by defining a vector from the real location 402D of a patterned feature from the ideal location 402C, and summing the vector for all patterned locations to provide a residual OVL value. The ideal and real locations 402C, 402D of the patterned features may be measured with an industry-standard metrology tool either in-line or off-line, and either during or after patterning. The metrology tool can also derive the real grid 400D from the real locations 402D, from which a real periodicity along the x-direction ($\Delta'_x$) and along the y-direction ($\Delta'_y$) may be computed. By comparing the ideal and real periodicities, the size of the mask before and after thermal expansion is indirectly determined.

Figure 4E:
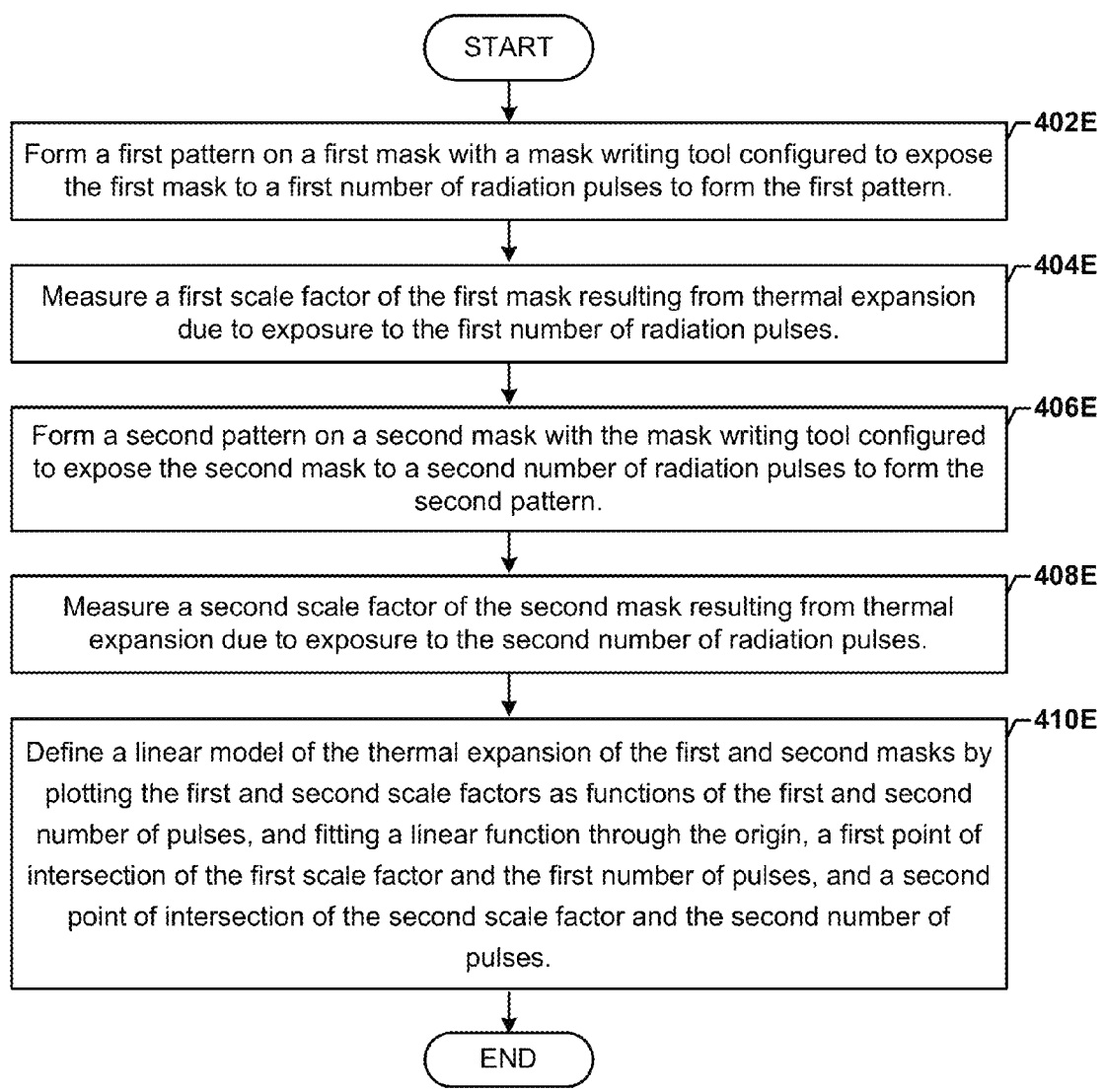

FIG. 4E illustrates some embodiments of a method 400E to mitigate thermal expansion of a mask during patterning by deriving a linear model of the thermal expansion of the mask.

At 402E a first pattern is formed on a first mask with a mask writing tool configured to expose the first mask to a first number of radiation pulses to form the first pattern.

At 404E a first scale factor of the first mask resulting from thermal expansion due to exposure to the first number of radiation pulses is measured.

At 406E a second pattern is formed on a second mask with the mask writing tool configured to expose the second mask to a second number of radiation pulses to form the second pattern.

At 408E a second scale factor of the second mask resulting from thermal expansion due to exposure to the second number of radiation pulses is measured.

At 410E a linear model of the thermal expansion of the first and second masks is defined by plotting the first and second scale factors as functions of the first and second number of pulses, and fitting a linear function through the origin, a first point of intersection of the first scale factor and the first number of pulses, and a second point of intersection of the second scale factor and the second number of pulses.

From the linear model, one may interpolate or extrapolate (402A) to determine the scale factor value from a third number of radiation pulses that had not been previously measured in the embodiments of FIG. 4A, and form a third pattern on a third mask after re-scaling the mask and geometries in the mask writing tool according to the scale factor value (i.e., inversely-scaling). To verify the improvement in OVL variability due to this method, the third mask may be patterned without re-scaling the mask and residing geometries, and the fourth mask may be patterned after re-scaling the mask and geometries in the mask writing tool. By using the third and fourth masks to pattern the first and second semiconductor substrates, and comparing the residual overlay between the third and fourth substrates after patterning, one may quantify the improvements brought by this method over some prior art approaches, and has been shown to improve OVL error to less than 4 nm and improve mask OVL performance by as much as 35% in some instances.

Figure 5:
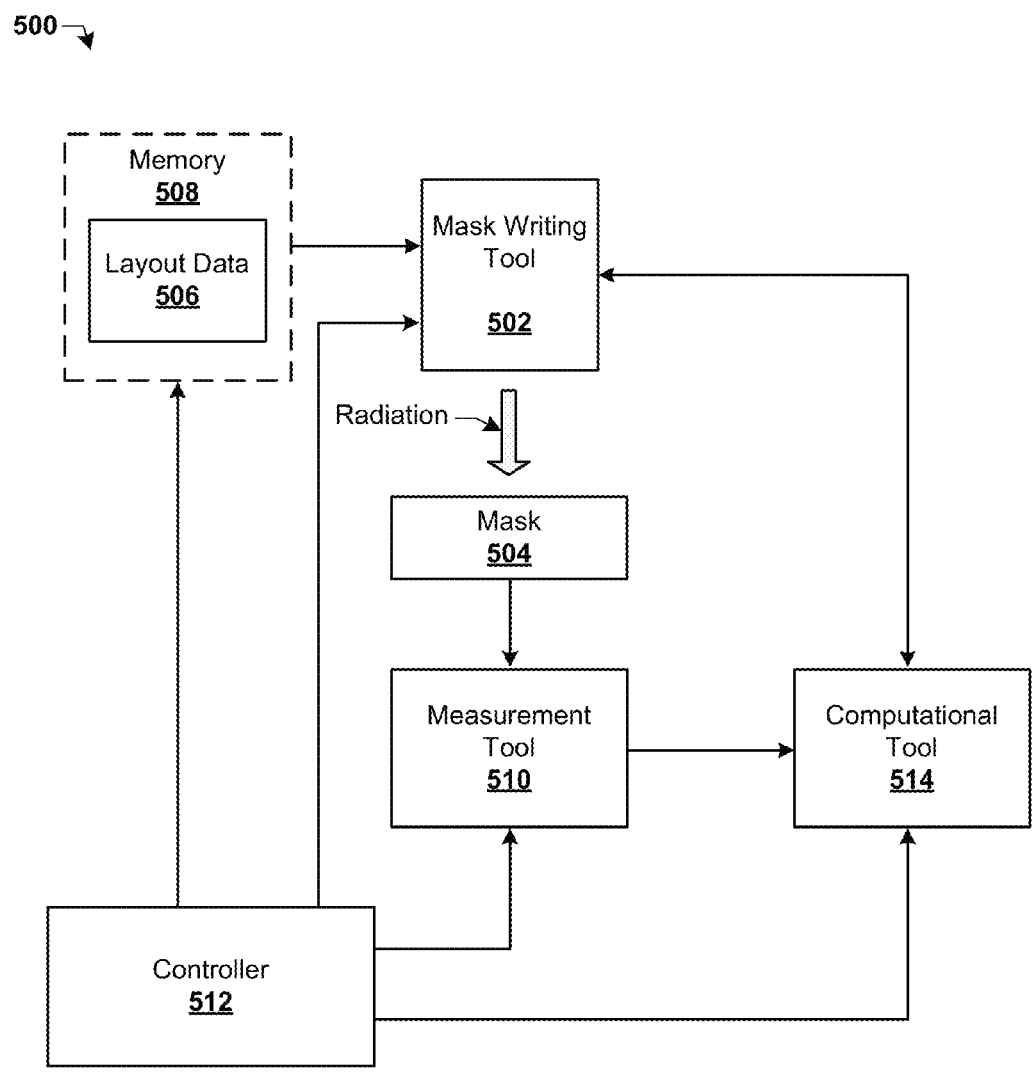
FIG. 5 illustrates some embodiments of a mask patterning system.

FIG. 5 illustrates some embodiments of a mask patterning system 500, comprising a mask writing tool 502 configured to expose a mask 504 to a focused beam of radiation to form a pattern on the mask 504. The mask writing tool 502 is configured to receive layout data 506 from a memory store 508.

In some embodiments, the mask writing tool 502 comprises a laser writing tool which utilizes laser light for mask patterning, or an electron beam writing tool which use a culminated beam of electrons for mask pattering, or a multi-beam (e.g., multi-e-beam) writing tool. A multi-beam writing tool can achieve a higher pattern density relative to a (single) e-beam or laser to reduce drawing time. A multi-beam writing tool introduces multiple electron beams which are filtered from a single source radiation by a programmable aperture plate system (APS). While patterning times are decreased because the multi-beam writing tool is limited by the APS rather than the complexity of patterned geometries, the multi-beam writing tool will transfer more heat to the mask 504, resulting in greater thermal expansion. The multi-beam writing tool can generate a maximum radiation dose of greater than about 450 $\mu C/cm^2$, compared to a maximum radiation dose of about 30 $\mu C/cm^2$ for some prior-art approaches.

The mask patterning system 500 further comprises a measurement tool 510 configured to measure dimensions of the mask 504 and geometries which are patterned on the mask 504 by the mask writing tool 502, wherein the patterned geometries are derived from the layout data 506. In some embodiments, the measurement tool 510 is utilized to measure first and second scale factors of first and second mask, respectively, as functions of the first and second number of radiation pulses from the mask writing tool 502. In some embodiments, the measurement tool 510 comprises an industry-standard metrology tool configured to determine the dimensions of the mask 504 indirectly by measuring real and ideal locations of locations of features patterned on a workpiece by the mask.

A controller 512 directs the mask writing tool 502 and measurement tool 510, as well as a computational tool 514 configured to receive the a first set of mask dimensions from the measurement tool 510 before patterning by the mask writing tool 502 and a second set of mask dimensions from the measurement tool 510 after patterning by the mask writing tool 502. The computational tool 514 is further configured to compute a scale factor from the first and second sets of mask dimensions.

In some embodiments, the computational tool 514 is further configured to determine a number of radiation pulses from the mask writing tool 502 necessary to pattern the mask 504. In associated embodiments, the computational tool 514 is configured to determine the scale factor as a function of radiation pulse number, and further configured to determine a scale factor value not measured for the mask 504 from the measured scale factors and the predetermined number of pulses by defining a linear model as described in the embodiments of FIGS. 4A-4B. From the scale factor value an inverse scale factor value is derived by the computational tool 514 and communicated to the mask writing tool 502, wherein the mask writing tool 502 is further configured to scale the patterned geometries by the inverse scale factor.

In some embodiments, wherein DP or MP lithography is utilized to decompose the layout data 506 onto multiple masks, the computational tool 514 is further configured to decompose layout geometries into two or more sub-patterns comprising two or more geometries disposed onto two or more masks, to determine the number of pulses needed to pattern the respective decomposed mask geometries on each of the two or more masks, and to determine an inverse scale factor value for each of the two or more masks corresponding to the number of pulses for the respective mask.

Therefore, it will be appreciated that some embodiments of the present disclosure relate to a method of patterning a workpiece with a mask, wherein a scale factor between a geometry of the mask and a corresponding target shape of the mask is determined. The scale factor results from thermal expansion of the mask and geometry due to heating of the mask during exposure to radiation by an electron beam (e-beam) in the mask manufacturing process. A number of radiation pulses necessary to dispose the geometry on the mask is determined. A scale factor for the mask is then determined from the number of pulses. The target shape is then generated on the mask by re-scaling the geometry according to the scale factor prior to mask manufacturing. This method compensates for thermal deformation due to e-beam heating to improve OVL variability in advanced technology nodes. This invention can be used for any kind of writer that utilizes energy-flow to active the photo-resist disposed on a mask blank which results in thermal expansion of the mask blank, such as an e-beam writer, laser writer, or multi-beam writer. And, the mask comprises a binary intensity mask (BIM), attenuated phase shift mask (APSM), or reflective reticle configured for extreme ultraviolet (EUV) lithography.

In some embodiments, a method patterning a workpiece with a mask is disclosed. The method comprises determining a scale factor between a geometry of the mask and a corresponding target shape of the mask, that results from mask manufacturing, and generating the target shape on the mask, by re-scaling the geometry according to the scaling factor, prior to mask manufacturing.

In some embodiments, a method of mask formation is disclosed. The method comprises determining a scale factor of the mask due to thermal expansion caused by radiation as a function of radiation pulse number used to pattern the mask with geometries, determining a number of pulses needed to pattern the mask, and re-scaling the mask and geometries by a scale factor value corresponding to the number of pulses prior to patterning to mitigate the thermal expansion effects on OVL control.

In some embodiments a mask patterning system is disclosed, which comprises a mask writing tool configured to expose a mask to a focused beam of radiation to form a pattern on the mask, and an measurement tool configured to measure dimensions of the mask and geometries which are patterned on the mask by the mask writing tool. A computational tool is configured to receive the a first set of mask dimensions from the measurement tool before patterning by the mask writing tool and a second set of mask dimensions from the measurement tool after patterning by the mask writing tool, and further configured to compute a scale factor from the first and second sets of mask dimensions. The computational tool is further configured to determine a number of radiation pulses needed to pattern the mask. The computational tool is further configured to determine the scale factor as a function of radiation pulse number, and further configured to determine a scale factor value for the mask from the scale factor and the number of pulses.

Although the disclosure has been shown and described with respect to a certain aspect or various aspects, equivalent alterations and modifications will occur to others of ordinary skill in the art upon reading and understanding this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the disclosure. In addition, while a particular feature of the disclosure may have been disclosed with respect to only one of several aspects of the disclosure, such feature may be combined with one or more other features of the other aspects as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of patterning a workpiece with a mask, comprising:
    determining a scale factor, between a geometry of the mask and a corresponding target shape of the mask, that results from mask manufacturing; and
    generating the target shape on the mask, by re-scaling the geometry according to the scaling factor, prior to mask manufacturing.

2. The method of claim 1, wherein determining the scale factor comprises:
    measuring thermal expansion of the mask caused by radiation as a function of a radiation pulse number, wherein the radiation is used to form the geometry on the mask; and
    determining a number of pulses necessary to form the geometry.

3. The method of claim 2, wherein the scale factor is determined by a method comprising:
    forming first geometries on a first mask with a mask writing tool configured to expose the first mask to a first number of radiation pulses to form the first geometries;

measuring a first scale factor of the first mask resulting from thermal expansion due to exposure to the first number of radiation pulses;

forming second geometries on a second mask with the mask writing tool configured to expose the second mask to a second number of radiation pulses to form the second geometries; and measuring a second scale factor of the second mask resulting from thermal expansion due to exposure to the second number of radiation pulses.

4. The method of claim 3, further comprising defining a linear model of the thermal expansion of the first and second masks by plotting the first and second scale factors as functions of the first and second number of pulses, and fitting a linear function through an origin of the plot, a first point of intersection of the first scale factor and the first number of pulses, and a second point of intersection of the second scale factor and the second number of pulses.

5. The method of claim 4, further comprising using the linear model to determine the scale factor value from a third number of radiation pulses used to form third geometries.

6. The method of claim 5, further comprising:
forming the third geometries on a third mask without re-scaling the mask and third geometries;
forming the third geometries on a fourth mask after re-scaling the mask and third geometries in the mask writing tool;
using the third and fourth masks to pattern first and second semiconductor substrates; and
comparing a residual overlay between the third and fourth masks after patterning.

7. The method of claim 2, further comprising:
decomposing two or more mask geometries onto two or more masks;
determining the number of pulses necessary to disposed the respective decomposed mask geometries on the two or more masks; and
re-scaling each of the two or more masks and respective decomposed mask geometries by the scale factor value corresponding to the number of pulses for the respective mask.

8. A method to mitigate thermal expansion of a mask during patterning, comprising:
forming first and second patterns on first and second masks with first and second numbers of respective radiation pulses by a mask writing tool; and
defining a linear model of the thermal expansion of the first and second masks by measuring first and second scale factors as functions of the first and second number of radiation pulses, and fitting a linear function through a first point of intersection of the first scale factor and the first number of radiation pulses, and a second point of intersection of the second scale factor and the second number of radiation pulses.

9. The method of claim 8, further comprising:
determining a third number of pulses necessary to pattern a third mask; and
determining a scale factor value from the third number of pulses and the linear model; and
re-scaling the third mask and patterned geometries by the scale factor value.

10. The method of claim 8, wherein the mask writing tool comprises a laser writing tool, an electron beam writing tool, or a multi-beam writing tool configured to pattern the first and second masks with one or more focused beams of radiation.

11. The method of claim 8, wherein the first or second mask comprises a binary intensity mask, attenuated phase shift mask, or reflective reticle configured for extreme ultraviolet lithography.

12. A method, comprising:
determining a first target dimension of a first target shape to be formed on a first mask;
forming a first shape corresponding to the first target shape on the first mask with a mask writing tool using a first number of radiation pulses, wherein the first shape has a first dimension when formed on the first mask;
determining a first scale factor, which comprises a first difference between the first dimension and the first target dimension; and
using the first scale factor to define a model, which predicts thermal expansion or contraction of a mask as a function of a number of radiation pulses.

13. The method of claim 12, further comprising:
determining a second target dimension of a second target shape to be formed on a second mask;
forming a second shape corresponding to the second target shape on the second mask with the mask writing tool using a second number of radiation pulses, wherein the second shape has a second dimension when formed on the second mask; and
determining a second scale factor, which comprises a second difference between the second dimension and the second target dimension; and
using the second scale factor to define the model.

14. The method of claim 13 wherein the model is a linear function passing through points corresponding to the first and second scale factors, and further comprising:
after determining the first and second scale factors, using the model to predict a scale factor for the mask based on an expected number of radiation pulses to be used to make the mask.

15. The method of claim 14, wherein the linear function comprises:
a first axis, along which the first and second number of pulses are plotted; and
a second axis, along which the first and second scale factors are plotted;
wherein the linear function includes a line that passes through a first point of intersection of the first scale factor and the first number of radiation pulses, and passes through a second point of intersection of the second scale factor and the second number of radiation pulses.

16. The method of claim 14,
wherein the first or second target dimension is a target width or target length of the first or second target shape; and
wherein the first or second dimension is a width or length of the first or second shape.

17. The method of claim 14,
wherein the first or second target dimension is a target area of the first or second target shape; and
wherein the first or second dimension is an area of the first or second shape.

18. The method of claim 12, wherein the first mask comprises:
a transparent substrate;
a layer of opaque material arranged over the transparent substrate; and
a mask layer arranged over the opaque layer.

19. The method of claim 18, wherein forming the first shape on the first mask comprises:

using the pulses of the radiation to form the first shape within the mask layer by removing portions of the mask layer with the pulses; and performing an etch through the mask layer to transfer the first shape into the layer of opaque material by using an etchant to remove portions of the layer of opaque material not covered by the mask layer.

20. The method of claim 12, wherein forming the first shape comprises using the pulses of the radiation to form the first shape within the mask by removing portions of the first mask with the pulses.

* * * * *